United States Patent
Hsu et al.

(10) Patent No.: US 6,429,468 B1
(45) Date of Patent: Aug. 6, 2002

(54) $IN_{0.34}A_{10.66}ASSB_{0.15}$/INP HFET UTILIZING INP CHANNELS

(75) Inventors: Wei-Chou Hsu; Yu-Shyan Lin; Chia-Yen Yeh, all of Tainan (TW)

(73) Assignee: National Science Council, Taipei ( * ) Notice: Subject to any disclaimer, the term of this patent is extended or adjusted under 35 U.S.C. 154(b) by 0 days.

(21) Appl. No.: 09/861,538

(22) Filed: May 22, 2001

(30) Foreign Application Priority Data

Dec. 30, 2000 (TW) .......................................... 08912478

(51) Int. Cl.[7] .............................................. H01L 31/072
(52) U.S. Cl. ........................ 257/194; 257/21; 257/190; 257/194
(58) Field of Search ................................. 257/21, 24, 27, 257/184, 190, 194; 438/167, 172, 571

(56) References Cited

U.S. PATENT DOCUMENTS

| | | | | |
|---|---|---|---|---|
| 5,479,032 A | * | 12/1995 | Forrest et al. | 257/184 |
| 6,133,593 A | * | 10/2000 | Boos et al. | 257/194 |
| 6,232,624 B1 | * | 5/2001 | Matloubian et al. | 257/194 |
| 6,287,946 B1 | * | 9/2001 | Micovic et al. | 438/167 |

OTHER PUBLICATIONS

Pobanz C. et al., "High Performance MMICs with Submillimeter Wave InP–based HEMTs", Indium Phosphide and Related Materials, 2000, pp. 67–70. IEEE Catalog No.: 00CH37107, May 2000.*

Su J. S. et al., "High–breakdown characteristics of the InP–based heterostructure field–effect transistor with In/sub 0.34/Al/sub 0.66/As/sub 0.85/Sb/sub 0.15/Schottky layer", IEEE Electron Device Letters, vol. 19, No. 6, Jun. 1998.*

Hsu W. C. "On the improvement of gate voltage swings in delta –doped GaAs/In/sub x/Ga/sub 1–x/As/GaAs pseudomorphic heterostructures", IEEE Transactions on Electron Devices, vol. 40, No. 9, Sep. 1993.*

Aleksey D. Andreev et al., "Theoretical Study of Thresholdless Auger Recombination In Comressively Strained InAlAsSb/GaSb Quantum Wells", *Appl. Phys. lett.*, 70(5), Feb. 3, 1997.

Sandeep R. Bahl et al., "Breakdown Voltage Enhancement from Channel Quantization in InAlAs/n+–InGaAs HFET's", *IEEE Electron Device Letters*, vol. 13, No. 2, Feb. 1992; and.

J. B. Shealy et al., "High–Breakdown–Voltage AlInAs/GaInAs Junction–Modulated HEMT's (JHEMT's) with Regrown Ohmic Contacts by MOCVD", *IEEE Electron Device Letters*, vol. 14, No. 2, Dec. 1993.

* cited by examiner

Primary Examiner—Hoai V. Ho
Assistant Examiner—Dao Nguyen
(74) Attorney, Agent, or Firm—Robert E. Bushnell, Esq.

(57) ABSTRACT

A double $\delta$-doped $In_{0.34} Al_{0.66}As_{0.85} Sb_{0.15}$/InP heterostructure field-effect transistor has been successfully grown by metalorganic chemical vapor deposition for the first time. Electron mobilities can be enhanced without sacrificing the carrier densities. A turn-on voltage as high as 1 V along with an extremely low gate reverse leakage current of 111 $\mu$A/mm at $V_{gs}=-40V$ is achieved. The three-terminal on-and off-state breakdown voltages are as high as 40.8V and 16.1V, respectively. The output conductance is as low as 1.8 mS/mm even when the drain-to-source voltage is 15V. The $g_{ds}$ is significantly smaller than that of our previously reported InAlAsSb/InGaAs/InP HFET. These characteristics are attributed to the use of the coupled $\delta$-doped structure, InP channel, $In_{0.34} Al_{0.66}As_{0.85} Sb_{0.15}$ Schottky layer'and to the large conduction-band discontinuity($\Delta$Ec) at the InAlAsSb/InP heterojunction.

7 Claims, 3 Drawing Sheets ized in this invention is the first time that double δ
$IN_{0.34}A_{10.66}ASSB_{0.15}/INP$ HFET UTILIZING INP CHANNELS

FIELD OF THE INVENTION

This invention, for the first time, tries to develop coupled δ-InP channel $In_{0.34}Al_{0.66}As_{0.85}Sb_{0.15}$/InP heterostructure field-effect transistor (HFET) on InP substrate through metalorganic chemical vapor deposition (MOCVD).

BACKGROUND OF THE INVENTION

As the transmittal property of InGaAs is better than that of GaAs, it is proved that the performance of InAlAs/InGaAS High Electron Mobility Transistor (HEMT) is superior to that of AlGaAs/GaAs HEMT in terms of high frequency and low noise. However, the higher output conduction and lower avalanche voltage restrict the application of InAlAs/InGaAS HEET in power amplifiers. The two main factors for this are: (1) the energy gap(Eg) of $In_{0.53}Ga_{0.47}As$ is only 0.73eV, only half of GaAS' energy gap of 1.42eV; and (2) The schottky potential energy barrier of $In_{0.52}Al_{0.48}As$ is 0.66ev, lower than that of AlGaAs (1eV).

Up to now, there are many documents published concerning methods of improving the avalanche voltage of High Electron Mobility Transistor (HEMT), but all of them have limited effect. The experimental result of $In_{0.34}Al_{0.66}As_{0.85}Sb_{0.15}/In_{0.75}Ga_{0.25}As$/InP HFET published by inventor (IEEE Electron Device Lett. Vol. EDL-19, pp.195–197, 1998) proves that, comparing with FETs with similar gate length in other documents published, the new design can significantly improve the avalanche voltage on two or three terminals of it. But, using InGaAs as channel layer has inherent defect, i.e. at higher suction-source voltage, there is still the problem of high conduction. In addition, X. Zheng et al.(Appl. Phys. Lett. Vol.62, pp.504–506, and Vol.62, pp.3455–3457, 1993) has proved that, when double δ doping structure has suitable space layer, the electrovalence rate in it will significantly increase due to coupling effect. But so for, relevant studies still concentrates on GaAs-based components.

SUMMARY OF THE INVENTION

The main purpose of this invention is to state a coupled δ-InP channel $In_{0.34}Al_{0.66}As_{0.85}Sb_{0.15}$/InP heterostructure field-effect transistor (HFET). Whether gd, is significantly smaller than that of our previously reported InAlAsSb/InGaAs/InP HFET. These characteristics are attributed to the use of the coupled δ-doped structure, InP channel, $In_{0.34}Al_{0.66}As_{0.85}Sb_{0.15}$ Schottky layer' and to the large conduction-band discontinuity(ΔEc) at the InAlAsSb/InP heterojunction.

Another purpose of this invention is to claim a methods for to manufacture the coupled δ-InP channel $In_{0.34}Al_{0.66}As_{0.85}$ $Sb_{0.15}$/InP heterostructure field-effect transistor (HFET).

The invention will now be described by way of example with reference to the accompanying Tables and Figures in which: certain illustrative embodiments thereof have been shown by way of example in the drawing and will herein be described in detail.

BRIEF DESCRIPTION OF THE DRAWINGS

Table 1 illustration the comparison between the O. Aina measurements of the HFET in the invention and other components.

Table 2 illustration growing conditions (at Growing temperature of 650° C. and growing pressure of 100 Torr)

Figure 1:
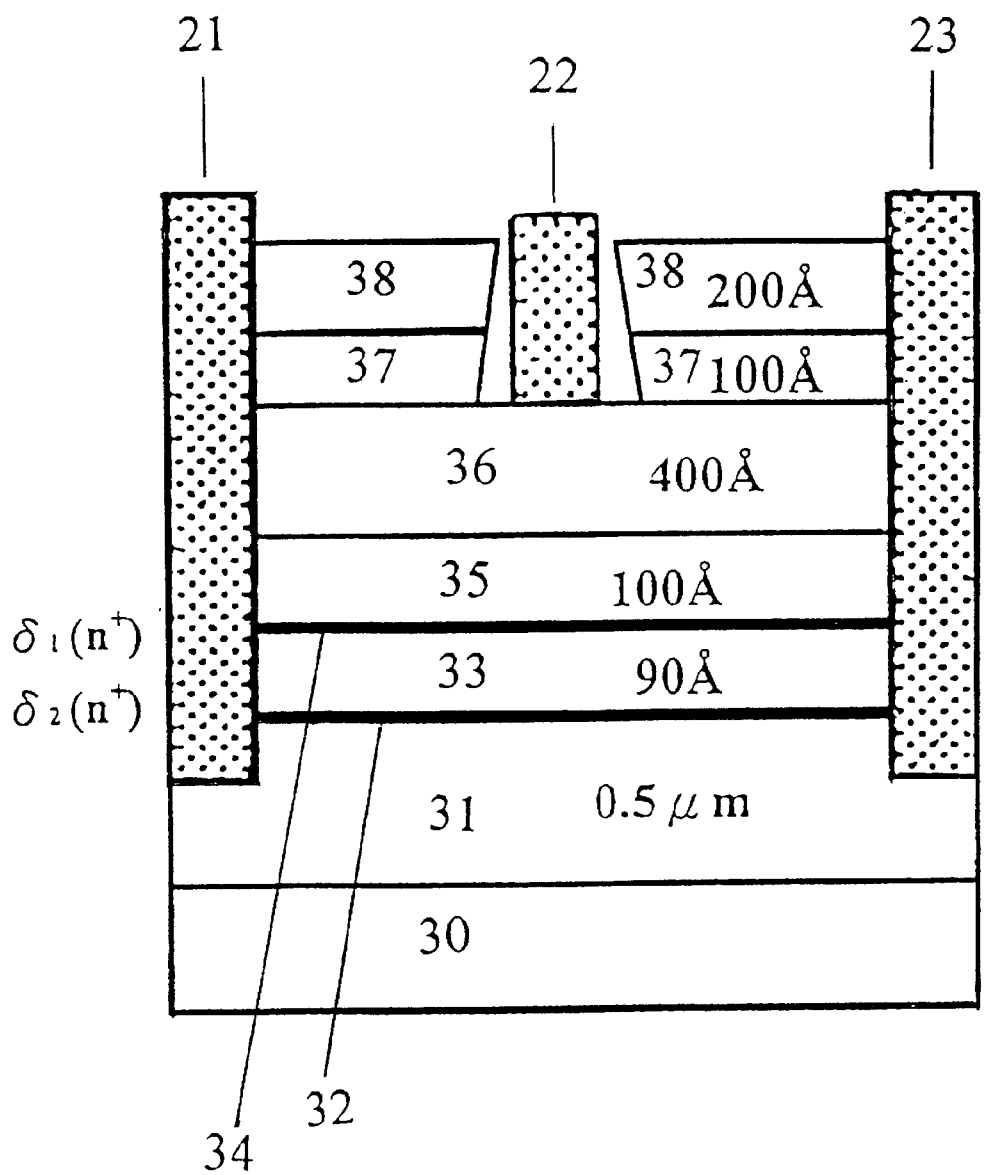
FIG. 1 the structure

21 . . . Source
22 . . . Gate
23 . . . Drain
30 . . . S.I.InP substrate
31 . . . Non-doping InP buffer layer
32 . . . $δ_2$-$n^+$ Inp doping layer
33 . . . Non-doping InP space layer
34 . . . $δ_1$-$n^+$ Inp doping layer
35 . . . Non-doping InP layer
36 . . . Non-doping Schottky layer
37 . . . Non-doping InGaAs obstructive layer
38 . . . $n^+$-Inp covering layer

DETAILED DESCRIPTION OF THE INVENTION

The double δ doping channel InAlAsSb/InP HFET revealed in this invention is the first time that double δ doping channel is build in heterogeneous structure, utilizing double δ doping to enhance the electronic coupling effect between layers and achieve higher electron concentration and electrovalence rate.

As shown in FIG. 1, the structure consists of:

Non-doping InP buffer layer 31 grown on semi-insolating Inp substrate 30; $δ_2$-$n^+$ Inp doping layer 32 grown on the Non-doping InP buffer layer 31;

Non-doping InP space layer 33 formed on the $δ_2$-$n^+$ Inp doping layer 32;

$δ_1$-$n^+$ Inp doping layer 34 grown on the Non-doping InP space layer 33;

Non-doping InP layer 35 grown on the $δ_1$-$n^+$ Inp doping layer 34;

Non-doping InAlAsSb Schottky layer 36 grown on Non-doping InP layer 35;

Non-doping InGaAs obstructive layer 37 grown on the Non-doping InAlAsSb Schottky layer 36; and the $n^+$-Inp covering layer 38 finally formed on the Non-doping InGaAs obstructive layer 37.

This invention advances a heterogeneous structural material system with δ-InP as the channel In AlAsSb/InP HFET. This material system features with: (1) In AlAsSb Schottky layer with high energygap (1.8 eV) and high Schottky potential energy barrier (>0.73 eV); and (2) that, according to the preliminary estimation of the invention, this new InAlAsSb/InP material system is in type II structure, and the conductive band discontinuity of its junction surface is higher than that of InAlAs/InP's junction surface (0.3 eV), thus having better carrier-confining effect.

In addition, using InP material as the channel in this invention has the following advantages: (1) high saturation speed, (2) large Γ—large energy band discontinuity (ΔEΓ-L~0.54 eV), (3) high thermal conductivity, (4) the value of energy gap is higher than that of $In_{0.53}Ga_{0.47}As$ (1.35 eV), thus having higher avalanche electric field and lower impact ionization factor. Experiments show that the 2-dimention cloud density, electrovalence rate, avalanche voltage and output conductivity of the double δ doping channel In AlAsSb/InP HFET developed in this invention are better than those of conventional InP-based HEFT, demonstrating the advantage of this material. The preliminary high-frequency measuring results demonstrate that its gaining cutoff frequency ($f\gamma$) of current is over 5 GHz when the length of the gate is 1.5 $\mu$m. Other researches are still being conducted.

The problems and technical categories this invention intends to solve are described respectively as below:

In the design of low-noise amplifier, for active components, the task is to design a low-noise transistor. As the high electrovalence rate of the component described in the invention can reduce the scattering effect of electron and donor ion and the resource of noise, it is suitable for applications in low-noise amplifiers. In addition, as the output power of a transistor normally limited by the control ability of that the reverse-breakdown voltage can increase the current between gate and suction, and higher initial voltage allows higher inducing current in the channel, enabling higher output power, so this component is suitable for application in high power amplifiers.

This invention employs low-pressure metalorganic chemical vapor deposition (LP-MOCVD), which is suitable for commercial application. And the structure and the processing procedure of the invention are also quite simple, suiting for mass production process.

The manufacturing method is growing double $\delta$ doping channel InAlAsSb/In PHFET on InP substrate with LP-MOCVD:

Forming a suction-pole and source pole on both sides of the above-mentioned InP covering layer in vapor deposition, and treating them with rapidly heating-up and annealing to form the ohmic contacts between InP covering layer and both the suction-pole and source-pole.

Making an opening between InP covering layer and both the suction-pole and one source pole, forming a gate in the groove aid making the gate to contact with the InAlAsSb layer.

The manufacturing process and the growing conditions are described in Table 2, and the detailed procedures are as follows:

Step (1) Mesa Etching:

The procedure is used to isolate each component to prevent the leakage current due to interaction of the components. Transferring the geometrical patterns from the photomask to the positive photoresist on the substrate with photolithography, then immerging the substrate in etchant, and finally lifting-off the photoresist with acetone. The etchant for InP is mixture of $H_3PO_4$ and HCl in proportion of 4:1. The etchant for In AlAsSb and InGaAs is made of $H_3PO_4$, $H_2O_2$ and water mixed in a proportion of 6:3:100. The photoresist is removed with acetone.

Step (2) Ohmic Contact Matalization:

After exposure and fixation, defining the suction-pole and source pole. Cleansing the substrate with solution of $NH_4OH$ and water in same proportion to remove the layer of oxide on it. Conducting vapor deposition in $8\times10^{-6}$ Torr environment; and as it is N type carrier component, using Gold-Germanium alloy (88% of Gold and 12% of Germanium) as the material for ohmic contact of the suction-pole and source pole. Plating a layer of Silver on the Gold-Germanium alloy to reduce the serial resistance of measuring probe. Lifting-off photoresist and metal stack-up layers with acetone, leaving metal only on the portion of suction-pole and source pole un-removed. Cleansing the substrate and treating it in RTA system, i.e. keep it staying at 120° C. for 24 seconds, and then increasing the temperature to 380° C., and keep it staying for 1 minute and 20 second, to form the ohmic contact.

Step (3) Schottky Contact Metalization:

In procedures similar to those in step (2), before vapor deposition, etching $n^+$-Inp covering layer with echant made of $H_3PO_4$ and HCL in a proportion of 4:1, then etching with the mixture of $H_3PO_4$, $H_2O_2$ and water in a proportion of 6:3:100 for 6 second. And finally, vapor-depositing Gold as the gate of Schottky contact.

The thickness of the growth buffer layer in the heterogeneous structure transistor is 0.5~1 $\mu$m., a 80~110 Å undoped InP space layer, a 90~150 Å undoped InP layer, a 200~500 Å undoped $In_{0.34}Al_{0.66}As_{0.85}Sb_{0.15}$ Schottky layer, a 50~110 Å InGaAs obstructive layer, a 200–500 Å $n^+$-Inp covering layer.

The Features of the Invention

The main feature of the invention is that it advances $In_{0.34}Al_{0.66}As_{0.85}Sb_{0.15}$/InP heterogeneous material system and applies the system in field-effect transistors. As AlInAs/InP HEMT has been published by O. Aina et at (*Electron Lett.* Vol.26, No.10, pp.651–652 1990), and single $\delta$ doping AlInAs/InP channel HEMt by Y. H. Jeong et al. (*Jpn. J. Appl. Phys.* Vol.31, No.2A, pp. L66–L67, 1992), the character of the $In_{0.34}Al_{0.66}As_{0.85}Sb_{0.15}$/InP heterogeneous contact surface in this invention could be preliminarily understood by referring to the relative relations of the characters of heterogeneous contact surface listed in those documents.

The $E_g(InP)$=1.35eV, $E_g(In_{0.53}Ga_{0.47}As)$=0.75eV, and $\Delta Ec$=0.2 eV, $\Delta Ev$=0.4 eV of InP/$In_{0.53}Ga_{0.47}As$ at 300K.

$E_g(In_{0.34}Al_{0.66}As_{0.85}Sb_{0.15})$=1.8eV, $E_g(In_{0.53}Ga_{0.47}As)$=0.75eV, $\Delta Ec$=0.945 eV, and $\Delta Ev$=0.105 eV of $In_{0.53}Ga_{0.47}As$/$In_{0.34}Al_{0.66}As_{0.85}Sb_{0.15}$.

$E_g(InP)$=1.35eV, $E_g(In_{0.52}Ga_{0.48}As)$=1.45eV, and $\Delta Ec$=0.3 eV, $\Delta Ev$=−0.194 eV (Type II) InP/$In_{0.52}Al_{0.48}As$.

Figure 2:
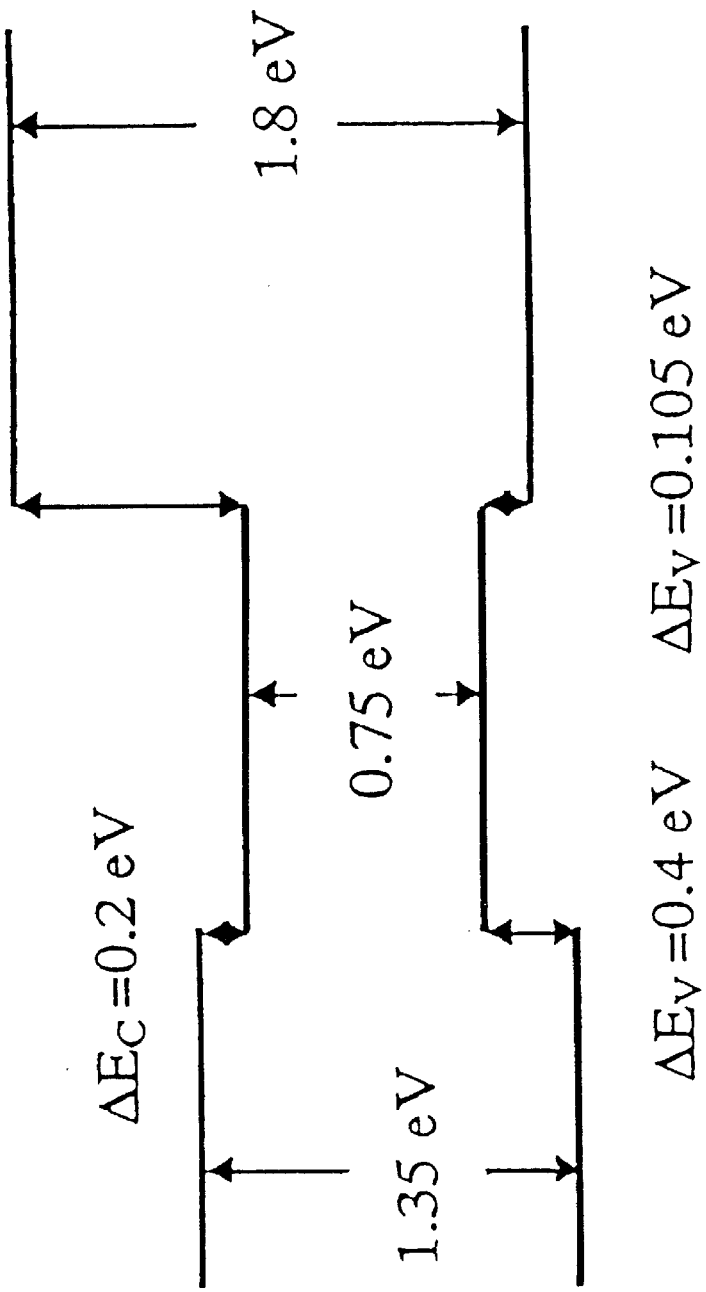
FIG. 2 illustration the energy band migration relations of $In_{0.53}Ga_{0.47}As$ and $In_{0.53}Ga_{0.47}As/In_{0.34}Al_{0.66}As_{0.85}Sb_{0.15}$ at 300 K FIG. 3 illustration the energy band Figure of $In_{0.34}Al_{0.66}As_{0.85}Sb_{0.15}$ contact surface at 300 K Reference Number Of The Attached Drawings.

Based on above data, the energy band migration relations of $In_{0.53}Ga_{0.47}As$ and $In_{0.53}Ga_{0.47}As$/$In_{0.34}Al_{0.66}As_{0.85}Sb_{0.15}$ at 300K are obtained and shown in FIG. 2 as the relative relation of heterogeneous structure energy band characters.

Figure 3:
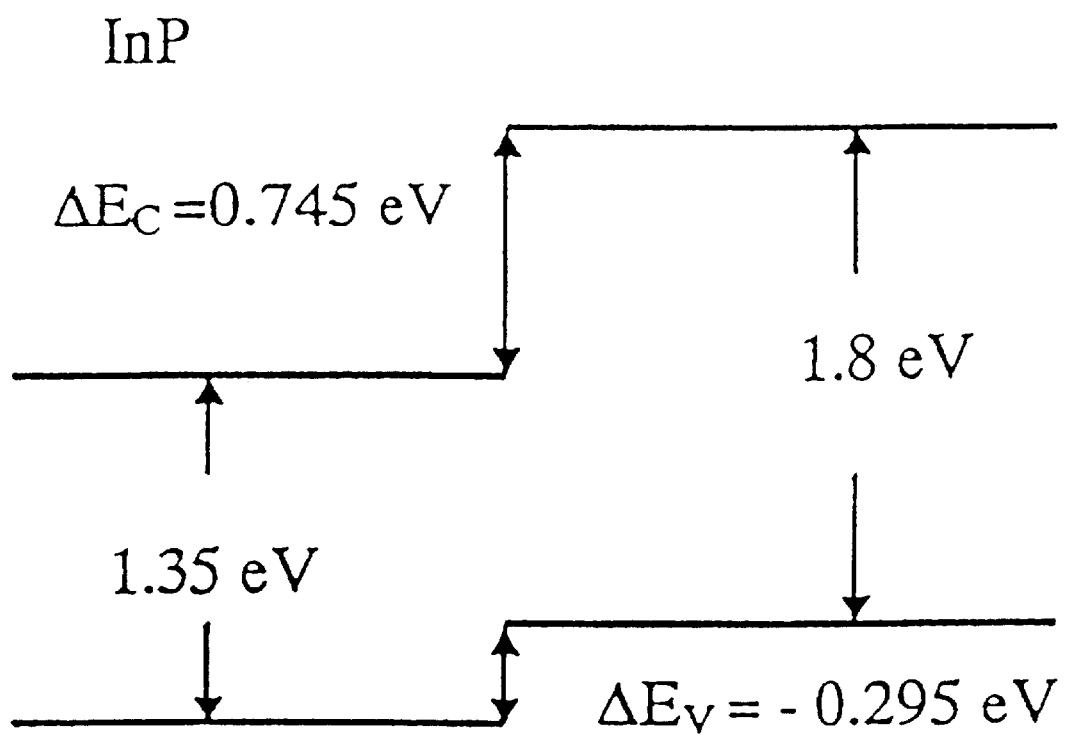

And from the relative relations, the energy band Figure of $In_{0.34}Al_{0.66}As_{0.85}Sb_{0.15}$ contact surface at 300 K is obtained and shown in FIG. 3 as the characters of heterogeneous contact surface. From $E_g(In_{0.34}Al_{0.66}As_{0.85}Sb_{0.15})$=1.8eV and $E_g(InP)$=0.745eV, it is known that the heterogeneous material system is of Type II. And for its $\Delta Ec$=0.745 eV, and $\Delta Ev$=−0.295eV, due to the $In_{0.34}Al_{0.66}As_{0.85}Sb_{0.15}$ heterogeneous structure of this invention, the $\Delta Ec$ value is as high as 0.745 eV, much higher than that of InP/$In_{0.52}Al_{0.66}As_{0.48}$ ($\Delta Ec$=0.3eV), thus achieving better carrier confining effect.

The 2-D electron cloud density and electrovalence rate is $3.3\times10^{12}$ cm$^{31\ 2}$ and 2761 cm$^2$ V.s respectively. The initial voltage is IV. The leakage current is only 111 $\mu$A/mm when bi-terminal backward gate-source voltage is at 40V. The tri-terminal avalanche voltage is 16.1V and tri-terminal avalanche voltage is as high as 40.8V. The said tri-terminal is off-state, Generally defined as the drain voltage of the turn-off device where a sharp rise Id occurs on the output I-V characteristics. In addition, the output conductivity is only 18 mS/mm even when the suction-source voltage is at 15V, significantly improving the InALAsSBIlnGaAs/InP HFETs with Ga—As channels, which has the problem of high output conductivity. All these advantages are resulted from (1)the use of double $\delta$ doping structure, (2) using InP as the channel and (3) the In AlAs Sb/InP material system used has high Schottky energy barrier, high energy gap and quite high conductive band discontinuity on the heterogeneous contact surface.

To sum up, the Invention has the features of creativity, novelty and innovativity. Although the Invention uses just a few better preparation examples disclosed as above, its application will not be limited to them. Anyone who is familiar with the said technique is able to amend and/or apply the said technique partially or totally without going beyond the Invention's spirit and coverage. Thus, the protection coverage of the Invention is determined by the descriptions stated in the application of patents.

TABLE 1

The comparison between the O.Aina measurements of the HFET in the invention and other components.

| | electrovalence rate (cm$^2$/V.s) | 2-D electron cloud density (×10$^{12}$cm$^{-2}$) |
|---|---|---|
| Double δ-doped InAlAsSb/InP HFET [This invention] | 2761 | 3.3 |
| Single δ-doped InAlAsSb/InP HFET [Y. H. Jeong et al.] | 1860 | 1.4 |
| InAlAsSb/InP HFET [O.Aina et al.] | 2100 | 1.5 |

TABLE 2

Growing conditions (at Growing temperature of 650° C. and growing pressure of 100 Torr)

| flow rate | Undoped InP | In$_{0.34}$Al$_{0.66}$As$_{0.85}$Sb$_{0.15}$ Schottky layer | InGaAs obstructive layer | δ-doping |
|---|---|---|---|---|
| TMI(ccm) (+27° C.) | 376 | 144 | 376 | 0 |
| TMA(ccm) (+17° C.) | 0 | 60 | 0 | 0 |
| TMG(ccm) (−14° C.) | 0 | 0 | 27.8 | 0 |
| TMSb(ccm) (+25° C.) | 0 | 50 | 0 | 0 |
| AsH$_3$(ccm) | 0 | 4.7 | 4.7 | 0 |
| PH$_3$(ccm) | 150 | 0 | 0 | 200 |
| SiH$_4$(ccm) | 0 | 0 | 0 | 10 |

TMI (Trimethylindium), TMA (Trimethylaluminum),
TMG (Trimethylgalium), TMSb (Trimethylantimony)

What is claimed is:

1. The structure of coupled δ-IaP channel In$_{0.34}$Al$_{0.66}$As$_{0.85}$Sb$_{0.15}$/InP heterostructure field-effect transistor (HFET), comprising:

Non-doping InP buffer layer grown on semi-insolating Inp substrate;

δ$_2$-n$^{30}$ Inp doping layer grown on the Nondoping InP buffer layer;

Non-doping InP space layer formed on the δ$_2$-n$^+$ Inp doping layer;

δ-n$^+$ Inp doping layer grown on the Non-doping InP space layer;

Non-doping InP layer grown on the δ-n$^+$ Inp doping layer;

Non-doping InAlAsSb Schottky layer grown on Non-doping InP layer;

Non-doping InGaAs obstructive layer grown on the Non-doping InAlAsSb Schottky layer; and the n$^{30}$-Inp covering layer finally formed on the Non-doping InGaAs obstructive layer.

2. A coupled δ-InP channel In$_{0.34}$Al$_{0.66}$AS$_{0.85}$Sb$_{0.15}$/InP heterostructure field-effect transistor (HFET), according the claim 1, thickness of the growth buffer layer in the heterogeneous structure transistor is 0.5~1£gm.

3. A coupled δ-InP channel In$_{0.34}$Al$_{0.66}$AS$_{0.85}$Sb$_{0.15}$/P heterostructure field-effect transistor (HFET), according the claim 1, thickness of the undoped MnP space layer is 80~110 Å.

4. A coupled δ-InP channel In$_{0.34}$Al$_{0.66}$As$_{0.85}$Sb$_{0.15}$/InP heterostructure field-effect transistor (HFET), according the claim 1, thickness of the undoped InP layer is 90~150 Å.

5. A coupled δ-InP channel In$_{0.34}$Al$_{0.66}$As$_{0.85}$Sb$_{0.15}$/InP heterostructure field-effect transistor (HFET), according the claim 1, thickness of the undoped In$_{0.34}$Al$_{0.34}$As$_{0.85}$Sb$_{0.15}$ Schottky layer is 200~500 Å.

6. A coupled δ-InP channel In$_{0.34}$Al$_{0.66}$As$_{0.85}$Sb$_{0.15}$/InP heterostructure field-effect transistor (HFET), according the claim 1, thickness of the InGaks obstructive layer is 50~110 Å.

7. A coupled δ-InP channel In$_{0.34}$Al$_{0.66}$As$_{0.85}$Sb$_{0.15}$/InP heterostructure field-effect transistor (HFET), according the claim 1, thickness of the n$^+$-InP covering layer is 200~500 Å.

* * * * *